United States Patent
Chen et al.

(10) Patent No.: US 7,961,766 B2
(45) Date of Patent: Jun. 14, 2011

(54) METHOD AND SYSTEM FOR CONTROLLING WAVELENGTHS OF MULTI-PATH LASER

(75) Inventors: Haiqing Chen, Shenzhen (CN); Qichao Ding, Shenzhen (CN); Hongpin Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/683,647

(22) Filed: Jan. 7, 2010

(65) Prior Publication Data

US 2010/0142572 A1 Jun. 10, 2010

Related U.S. Application Data

(63) Continuation of application No. PCT/CN2008/073747, filed on Dec. 26, 2008.

(30) Foreign Application Priority Data

Dec. 29, 2007 (CN) .......................... 2007 1 0033057

(51) Int. Cl.
*H01S 3/13* (2006.01)
(52) U.S. Cl. ................ 372/29.02; 372/34; 372/38.01
(58) Field of Classification Search ............... 372/38.01, 372/29.02
See application file for complete search history.

(56) References Cited

U.S. PATENT DOCUMENTS

| | | | |
|---|---|---|---|
| 5,589,970 A | 12/1996 | Lyu et al. | |
| 6,118,562 A | 9/2000 | Lee et al. | |
| 6,369,926 B1 | 4/2002 | Lyu et al. | |
| 6,501,773 B1 | 12/2002 | Volz et al. | |
| 6,567,198 B1 * | 5/2003 | Kang | ................ 398/91 |
| 7,218,864 B2 | 5/2007 | Lee | |
| 2003/0108353 A1 | 6/2003 | Nasu et al. | |

FOREIGN PATENT DOCUMENTS

| | | |
|---|---|---|
| CN | 1252654 A | 5/2000 |
| CN | 1396739 A | 2/2003 |
| WO | 2006089453 A1 | 8/2006 |

* cited by examiner

*Primary Examiner* — Jessica T Stultz
*Assistant Examiner* — Xinning Niu
(74) *Attorney, Agent, or Firm* — Leydig, Voit & Mayer, Ltd.

(57) ABSTRACT

A method for controlling wavelengths of a multi-path laser is provided. The method includes: obtaining a difference between an actual output wavelength and a target output wavelength of each laser (S601); obtaining a corrected control amount of a temperature controller of each laser by decoupling calculation according to the difference (S602); and determining a die temperature of each laser according to the corrected control amount of the temperature controller (S603). A system for controlling wavelengths of a multi-path laser includes a multi-path laser (10), a difference module (12), a decoupling module (14), and a temperature control module (16).

8 Claims, 7 Drawing Sheets

METHOD AND SYSTEM FOR CONTROLLING WAVELENGTHS OF MULTI-PATH LASER

CROSS-REFERENCE TO RELATED APPLICATIONS

This application is a continuation of International Application No. PCT/CN2008/073747, filed on Dec. 26 2008, which claims priority to Chinese Patent Application No. 200710033057.1, filed on Dec. 29, 2007, both of which are hereby incorporated by reference in their entireties.

FIELD OF THE TECHNOLOGY

The present invention relates to the field of optical communications, and more particularly to a method and system for controlling wavelengths of a multi-path laser.

BACKGROUND OF THE INVENTION

Current communication networks have increasingly higher requirements for the transmission bandwidth, and accordingly, the technology of synthesizing optical signals of multiple wavelengths into one signal (wavelength division multiplexing, WDM) for transmission in an optical fiber emerges. In a WDM system, especially a dense WDM (DWDM) system (e.g., a WDM system having wavelength intervals less than or equal to 50 GHz), the wavelength of each wavelength division multiplexed optical signal is required to have high precision and stability. Since the wavelength of an optical signal output from a laser varies with a die temperature of the laser, a system is required to lock and control the die temperature of each laser.

In the prior art, a single control system locks and controls die temperatures of multiple lasers. FIG. 1 shows a system for controlling wavelength of each optical signal output from a multi-path laser. Optical signals are generated by optical transmitters and are synthesized into one signal by a multiplexer. Relevant wavelength information is obtained after a series of signal processing operations are performed on the signal. A controller obtains a control amount of a die temperature of each laser (i.e., optical transmitter) by calculation and delivers it to the corresponding laser. This system controls die temperatures of the independent lasers in turn by a polling method, so as to finally realize the control and locking wavelength of optical signal output from the laser.

In the above multi-path WDM system, an integrated laser array is generally used to output the synthesized multiple optical signals. Such an array arrangement of the lasers increases cross-talk coupling between the die temperatures of the lasers, that is, the adjustment of the wavelength of optical signal output from a certain laser will bring unexpected changes to wavelengths of optical signals output from other lasers. However, the above system for controlling wavelengths of optical signals output from the multi-path laser does not take such cross-talk coupling into consideration, and thus cannot perform decoupling control on the thermal cross-talk between the lasers, so that the convergence time for wavelength control is lengthened.

SUMMARY OF THE INVENTION

The present invention is directed to a method and system for controlling wavelengths of a multi-path laser, which are capable of effectively solving the problem of thermal cross-talk between lasers in the multi-path laser.

On one hand, in an embodiment, the present invention provides a method for controlling wavelengths of a multi-path laser, which includes: obtaining a difference between an actual output wavelength and a target output wavelength of each laser; obtaining a corrected control amount of a temperature controller of each laser by decoupling calculation according to the difference; and determining a die temperature of each laser according to the corrected control amount of the temperature controller.

On the other hand, in an embodiment, the present invention provides a system for controlling wavelengths of a multi-path laser, which includes a multi-path laser, a difference module, a decoupling module, and a temperature control module.

The multi-path laser is adapted to generate and output optical signals.

The difference module is adapted to calculate a difference between an actual output wavelength and a target output wavelength of each optical signal output from the multi-path laser.

The decoupling module is adapted to obtain a corrected control amount of a temperature controller of each laser by decoupling calculation according to the difference calculated by the difference module.

The temperature control module is adapted to determine a die temperature of each laser according to the corrected control amount obtained by the decoupling module.

In the specific embodiments of the present invention, when the temperature controller of each laser is controlled, the influence of a change of a die temperature of one laser on die temperatures of other lasers is considered and wiped off from the control of the die temperatures of the other lasers, so the problem of thermal cross-talk between the lasers in the multi-path laser is effectively solved, the time for adjusting wavelengths of the multi-path laser is shortened, and the efficiency of the system is improved.

DETAILED DESCRIPTION OF THE EMBODIMENTS

Figure 1:
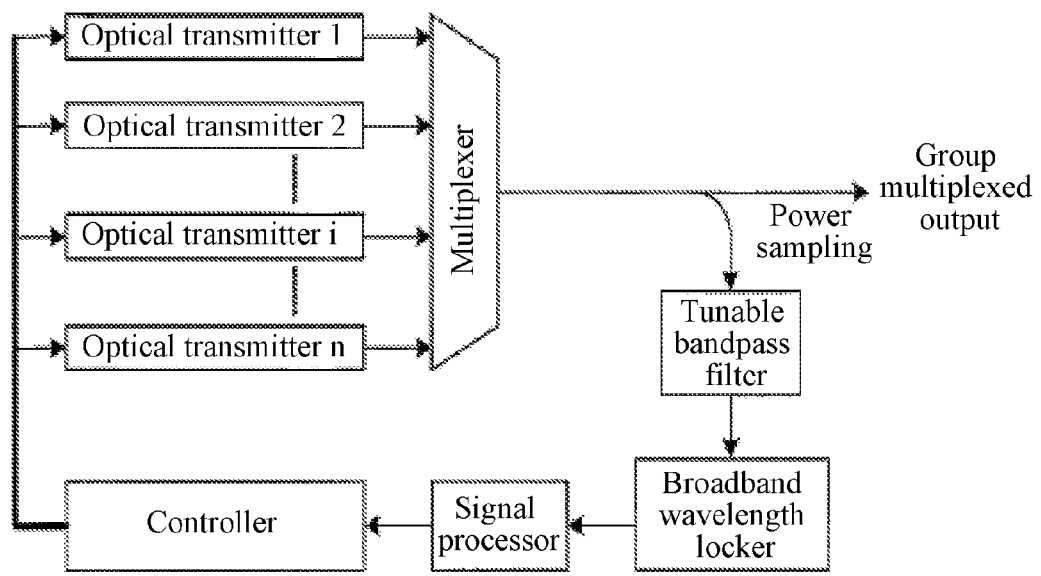
FIG. 1 is a view of a conventional system for controlling wavelengths of a multi-path laser.

Some exemplary embodiments of the present invention are described below with reference to the accompanying drawings. In the accompanying drawings, like reference numerals are used to indicate like elements in different figures.

Figure 2:
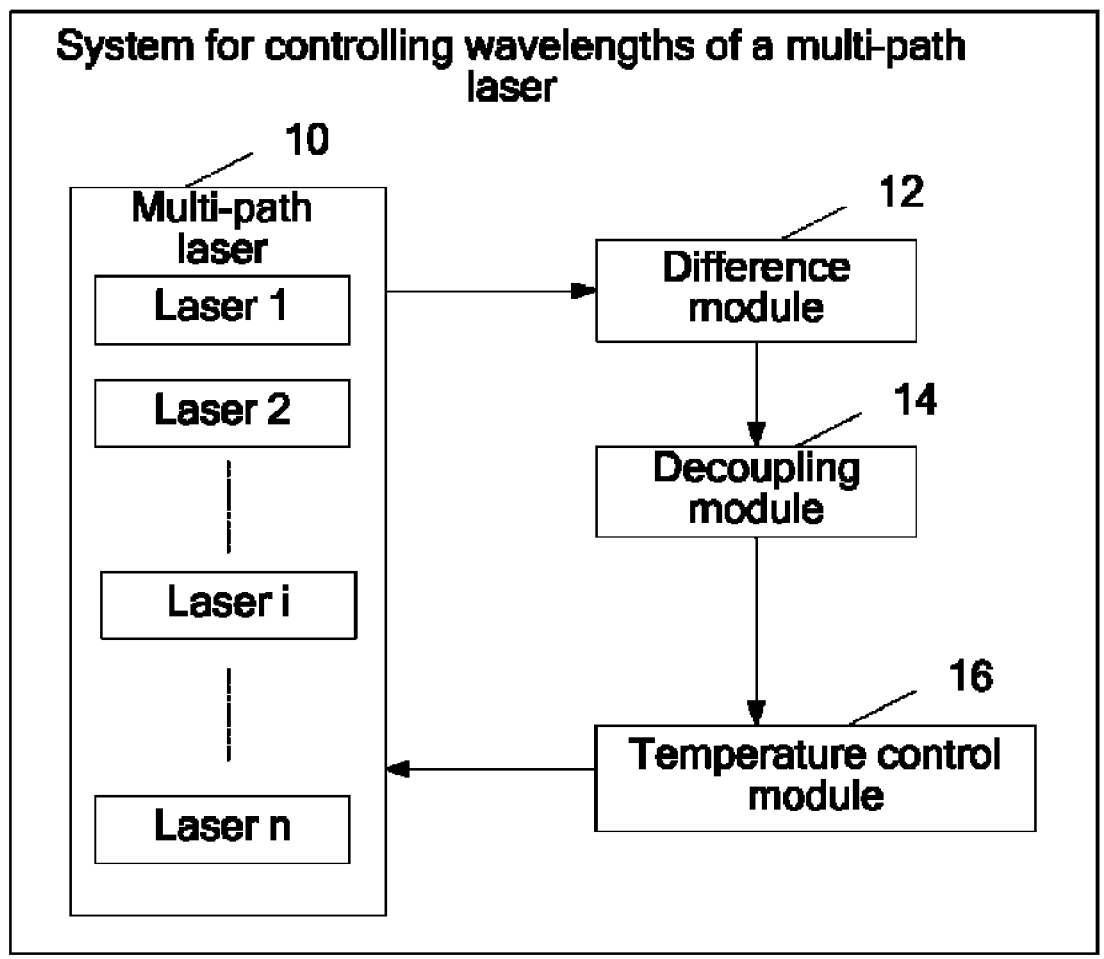
FIG. 2 is a schematic structural view of a system for controlling wavelengths of a multi-path laser according an embodiment of to the present invention.

FIG. 2 is a schematic view of a system for controlling wavelengths of a multi-path laser according to an embodiment of the present invention. The system includes a multi-path laser 10, a difference module 12, a decoupling module 14, and a temperature control module 16.

The multi-path laser 10 is adapted to generate required multiple optical signals. The multi-path laser may be a laser array. For example, the multi-path laser shown in the figure has n lasers in total.

The difference module 12 is adapted to calculate a difference between an actual output wavelength and a target output wavelength of each optical signal output from the multi-path laser 10. The actual calculation may be realized by adding a disturbance slice time, which is specifically as follows. A disturbance slice time that is a preset fixed value is added to a modulation drive and control circuit of each laser. In this way, the optical signal output from the laser also contains a corresponding low frequency disturbance component. A change of the low frequency disturbance component resulting from a change of the wavelength of the optical signal output from the laser can be detected after the multiple optical signals are multiplexed and pass through a filter. A difference of wavelengths can be obtained by subtracting the disturbance slice time obtained after change from the original disturbance slice time added in advance.

Figure 3:
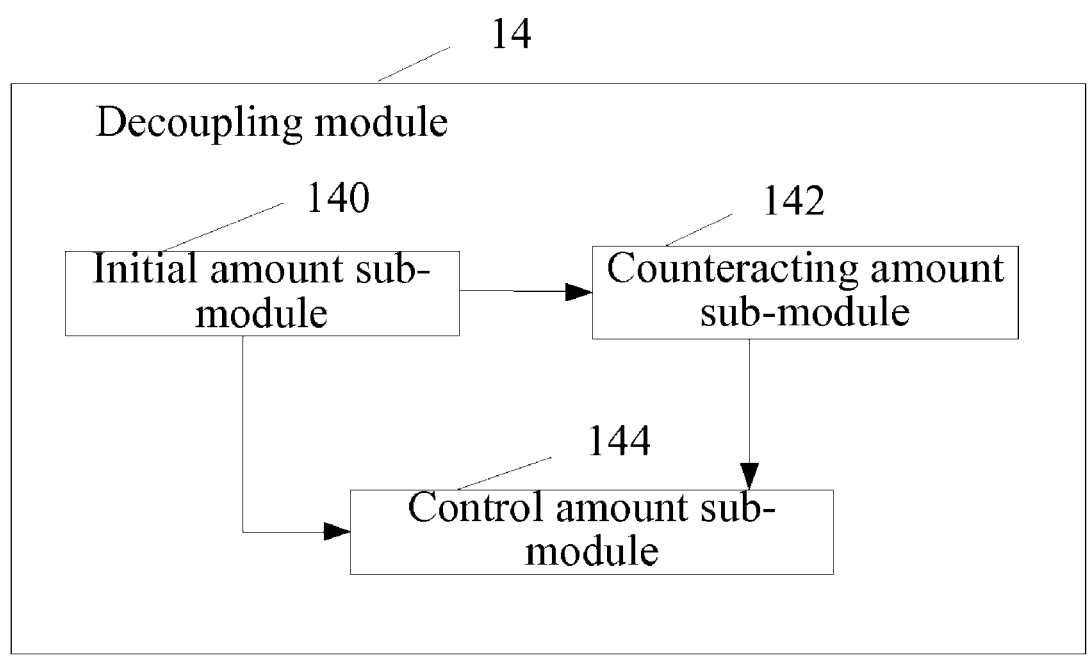
FIG. 3 is a schematic structural view of a decoupling module shown in FIG. 2 according an embodiment of to the present invention.

The decoupling module 14 is adapted to obtain a control amount of a temperature controller of each laser by decoupling calculation according to the difference calculated by the difference module. The decoupling calculation refers to calculating an influence amount that is caused by control amounts of other lasers on one laser when a control amount of the temperature controller of each laser is calculated, and correcting the control amount according to the influence amount caused by the control amounts of other lasers on the laser. Referring to FIG. 3, the decoupling module 14 may specifically include an initial amount sub-module 140, a counteracting amount sub-module 142, and a control amount sub-module 144. The initial amount sub-module 140 is adapted to calculate an initial control amount of each laser according to the difference between an actual output wavelength and a target output wavelength of optical signal output from each laser calculated by the difference module 12. The counteracting amount sub-module 142 is adapted to calculate, according to the initial control amount of each laser obtained by the initial amount sub-module 140, a counteracting control amount of each laser, where the counteracting control amount is generated because one laser is affected by the initial control amount of the temperature controller of each of other lasers. The control amount sub-module 144 is adapted to calculate a corrected control amount of each laser according to the initial control amount obtained by the initial amount sub-module 140 and the counteracting control amount obtained by the counteracting amount sub-module 142.

Figure 4:
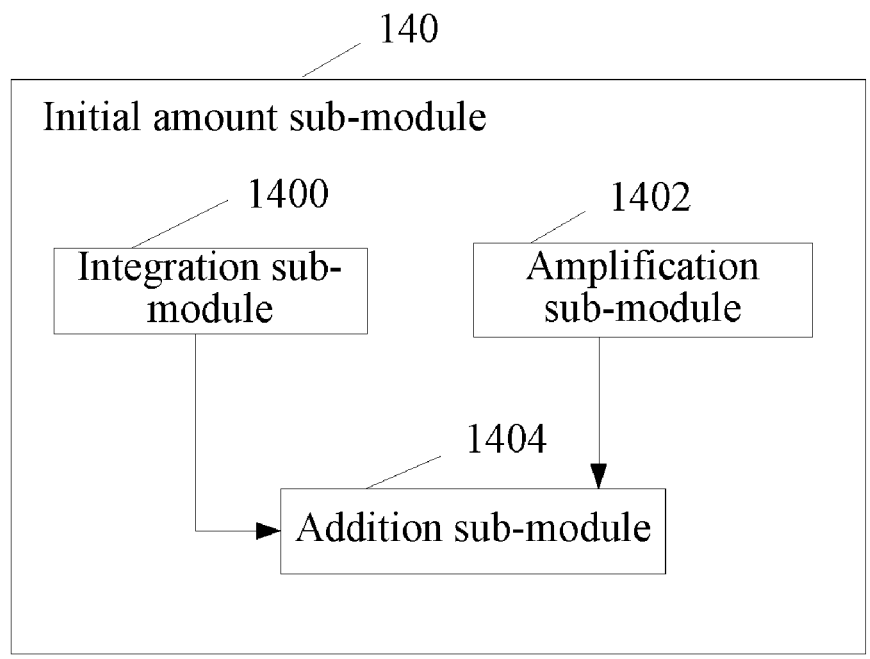
FIG. 4 is a schematic structural view of an initial amount sub-module shown in FIG. 3 according an embodiment of to the present invention.

Furthermore, as shown in FIG. 4, the initial amount sub-module 140 may further include an integration sub-module 1400, an amplification sub-module 1402, and an addition sub-module 1404. The integration sub-module 1400 is adapted to perform integration on the difference between an actual output wavelength and a target output wavelength of optical signal output from each laser to obtain an integral difference. The amplification sub-module 1402 is adapted to perform proportional amplification on the difference between an actual output wavelength and a target output wavelength of optical signal output from each laser to obtain an amplified difference. The addition sub-module 1404 is adapted to obtain the initial control amount for each laser, by adding the integral difference corresponding to the laser obtained by the integration sub-module 1400, and the amplified difference corresponding to the laser obtained by the amplification sub-module 1402.

Figure 5:
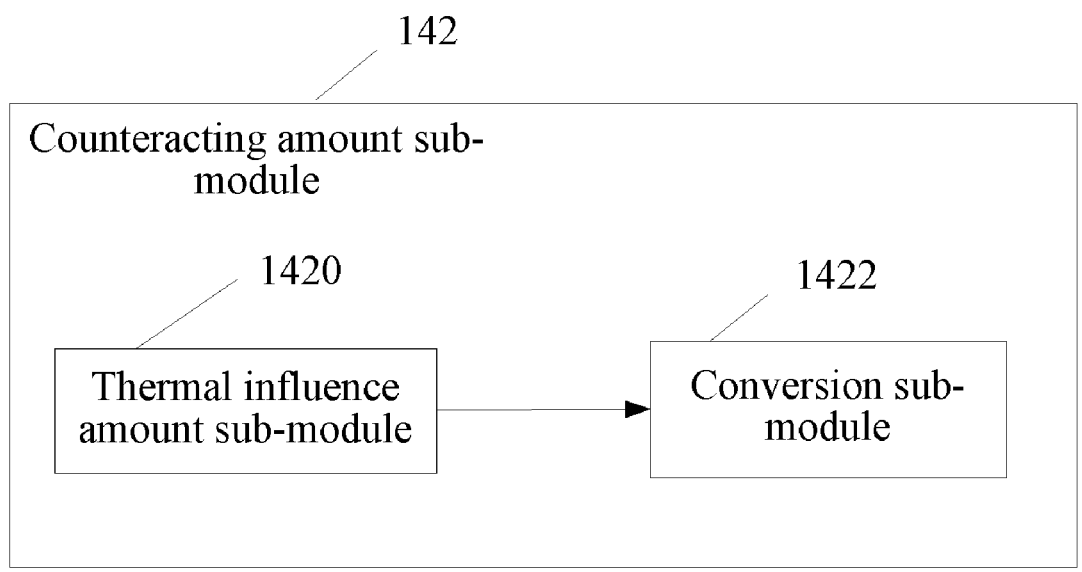
FIG. 5 is a schematic structural view of a counteracting amount sub-module shown in FIG. 3 according an embodiment of to the present invention.

As shown in FIG. 5, the counteracting amount sub-module 142 may further include a thermal influence amount sub-module 1420 and a conversion sub-module 1422. The thermal influence amount sub-module 1420 is adapted to obtain a thermal influence amount on a die temperature of each laser, where the thermal influence amount is generated because one laser is affected by other lasers, after a die temperature of each laser is controlled according to the initial control amount of each laser. Specifically, the thermal influence amount sub-module is adapted to obtain a thermal influence amount for each laser, where the the thermal influence amount is generated because one laser is affected by a die temperature of each of other lasers. The thermal influence amount for each laser is a thermal influence amount raised by a die temperature of each of other lasers after a die temperature of each laser is controlled according to the initial control amount of each laser. The conversion sub-module 1422 is adapted to calculate, according to the thermal influence amount obtained by the thermal influence amount sub-module 1420, a counteracting control amount of the temperature controller of each laser, where the counteracting control amount is generated because one laser is affected by the initial control amount of the temperature controller of each of other lasers.

Figure 6:
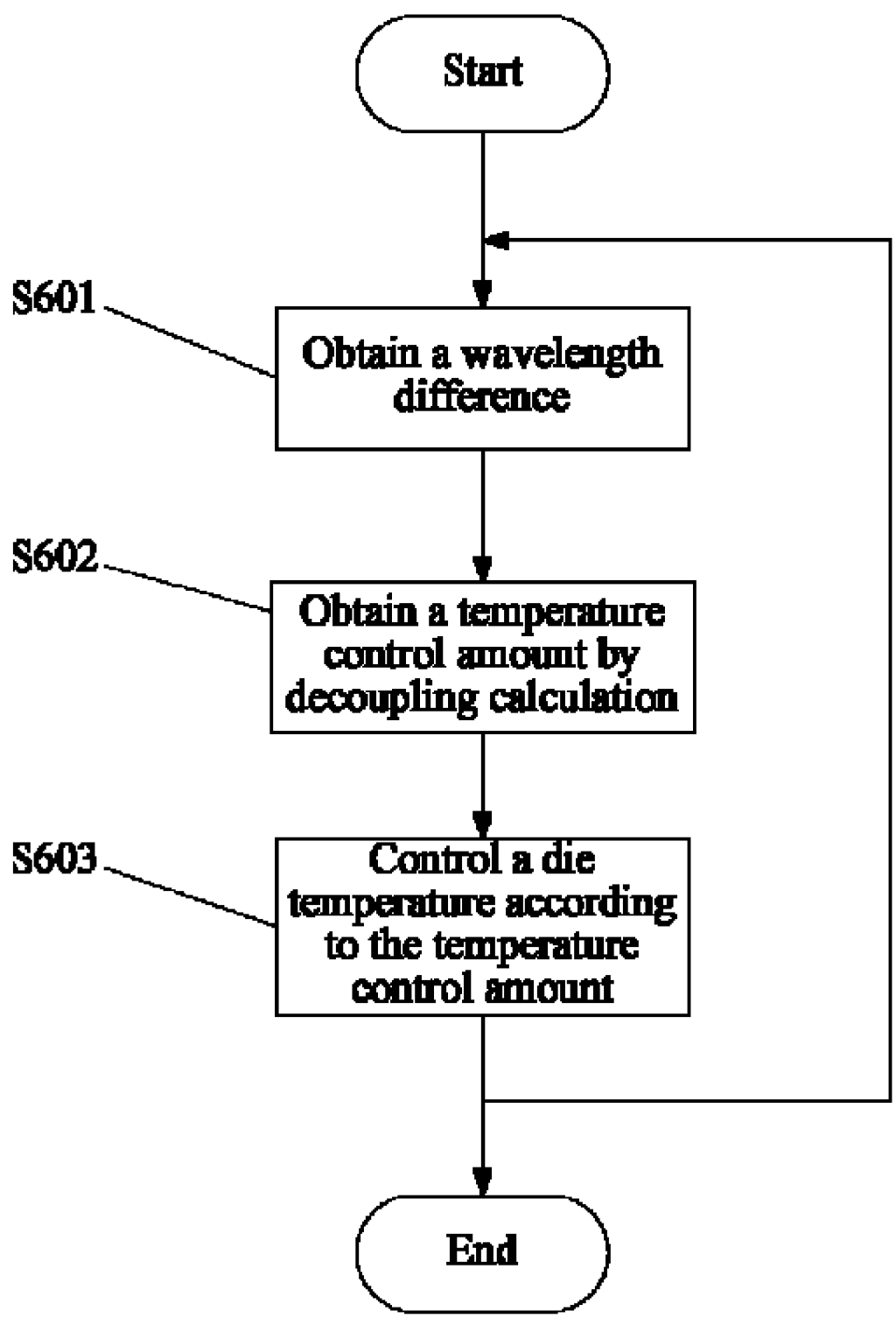
FIG. 6 is a schematic flow chart of a method for controlling wavelengths of a multi-path laser according to an embodiment of the present invention.

Accordingly, an embodiment of the present invention further provides a method for controlling wavelengths of a multi-path laser. As shown in FIG. 6, the process includes the following steps.

In step S601, a difference between an actual output wavelength and a target output wavelength of each laser is obtained. As shown above, the difference may be obtained by adding a fixed disturbance slice time. Persons skilled in the art should know that, this embodiment of the present invention gives an example only, and other methods may also be used to calculate the wavelength difference in other embodiments and will not be described in detail in this embodiment.

In step S602, a control amount of a temperature controller of each laser is obtained by decoupling calculation according to the difference. Specifically, the process may be as follows.

In step a, integration is performed on the difference between an actual output wavelength and a target output wavelength of each laser to obtain an integral difference.

In step b, proportional amplification is performed on the difference between an actual output wavelength and a target output wavelength of each laser to obtain an amplified difference. This step may be performed at the same time as step a.

In step c, an initial control amount is obtained for each laser, by adding the integral difference corresponding to the laser and the amplified difference corresponding to the laser.

In step d, a thermal influence amount on a die temperature of each laser is obtained. The thermal influence amount for each laser is generated because one laser is affected by other lasers, after the die temperature of each laser is controlled according to the initial control amount of each laser In step e, a counteracting control amount of the initial control amount of each laser is calculated according to the thermal influence amount, where counteracting control amount is generated because one laser is affected by the initial control amount of each of other lasers.

In step f, a corrected control amount of each laser is calculated according to the initial control amount and the counteracting control amount, and the process may specifically include adding the initial control amount of each laser and a sum of counteracting control amounts of other lasers on the present laser to obtain the control amount of each laser.

In step S603, a die temperature of each laser is set (or determined) by controlling the temperature controller of each laser according to the control amount.

In order that the difference between the actual output wavelength and the target output wavelength of each laser of the multi-path laser is in a predetermined range, the above steps may be performed cyclically until the required laser output wavelength is obtained.

Figure 7:
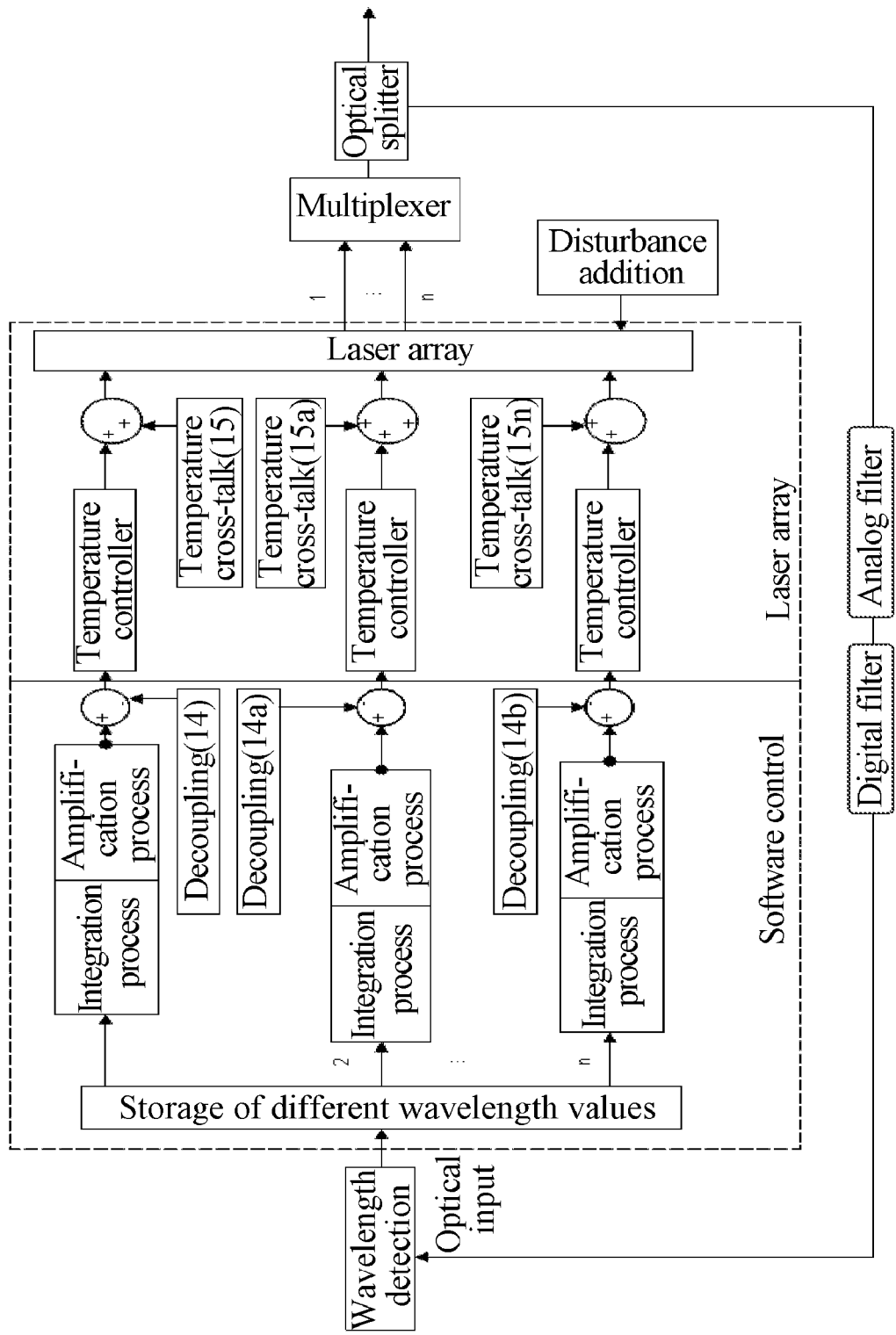
FIG. 7 is a schematic structural view of a system for controlling wavelengths of a multi-path laser according to another embodiment of the present invention.
Figure 8:
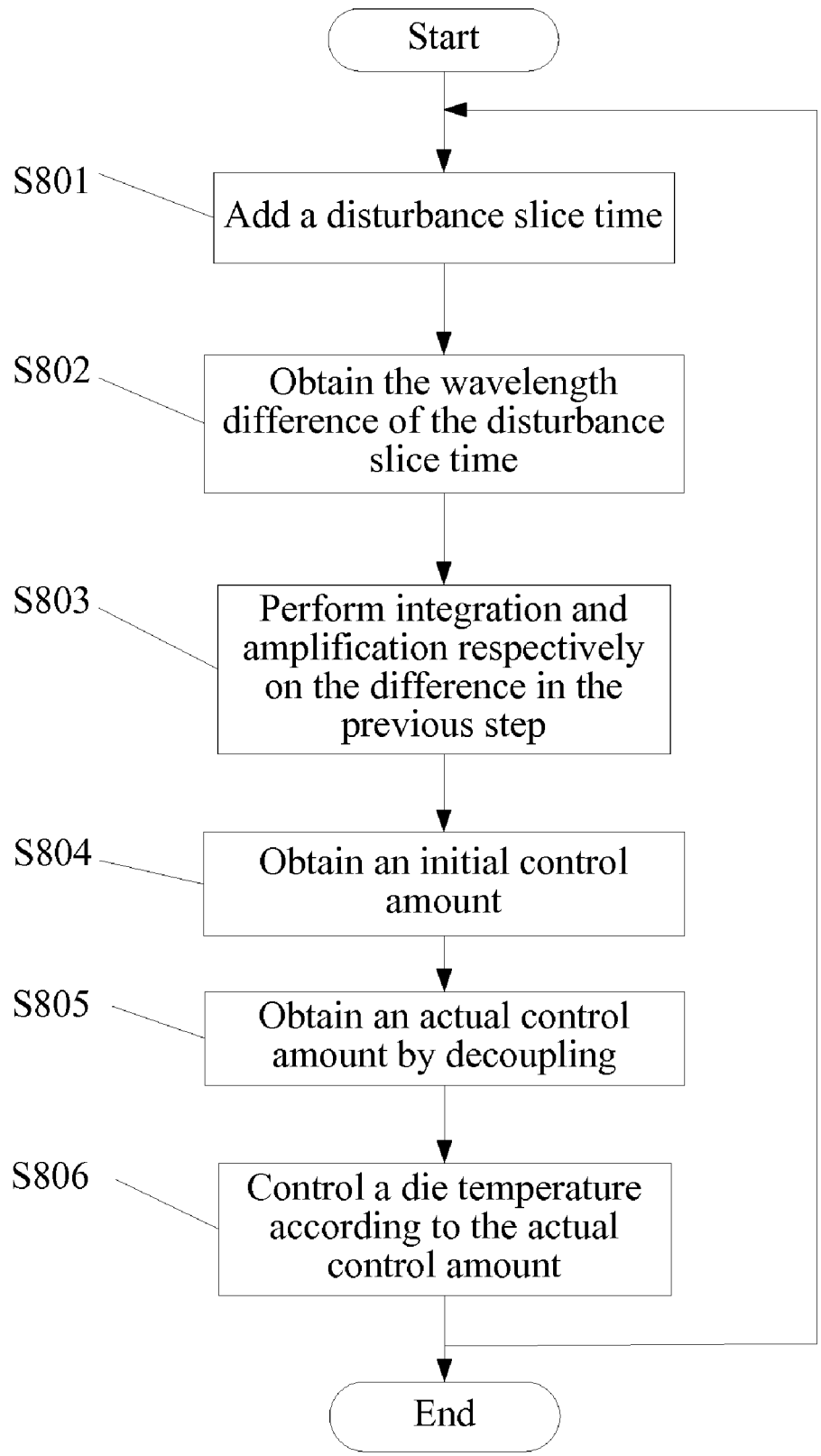
FIG. 8 is a schematic flow chart of a method for controlling wavelengths of a multi-path laser according to another embodiment of the present invention.

The above process is illustrated further below with reference to another specific embodiment of a system for controlling wavelengths of a multi-path laser in the present invention shown in FIG. 7. As shown in FIG. 8, the process includes the following steps.

In step S801, a fixed disturbance slice time is added to a modulation drive and control circuit of each laser.

In step S802, multiple optical signals having disturbance components are output from a laser array and pass through a multiplexer, an optical splitter, a digital filter, an analog filter, and wavelength detection, then a wavelength difference of the added disturbance slice time is obtained, and the difference and wavelength value of the disturbance slice time are stored.

In step S803, integration and amplification are respectively performed on the wavelength difference of the disturbance slice time of each laser to obtain an integral value of the difference and an amplified value of the difference.

In step S804, the integral value of each laser and the amplified value of each laser that are obtained in the step S803 are added to obtain an additive value, and then the additive value is converted into a corresponding initial control amount of a temperature controller of each laser.

In step S805, decoupling calculation is performed to obtain an actual control amount (i.e., a corrected control amount) of the temperature controller.

Specifically, if a temperature initial control amount of the 1st laser in the laser array is $W_1$, a thermal influence amount $Y_{1-n}$ for the nth laser is generated because the nth laser is affected by heating the die temperature of the 1st laser according to the initial control amount $W_1$, where the thermal influence amount $Y_{1-n}$ is denoted as $Y_{1-n}=f_{1-n}(n)$ (the equation is derived from empirical data), and then accordingly, thermal influence amounts on other lasers may be denoted as $Y_{2-n}=f_{2-n}(n)$, $Y_3$-n=$f_{3-n}(n)$, ..., $Y_{n-n}=f_{n-n}(n)$. The corresponding thermal influence amounts are converted into a control amount which is denoted as $C=K(f(n))$, which is equivalent to that a control amount $C_{1-n}=K_{1-n}(W_1)$ is also added indirectly to the nth laser when the first laser is controlled.

The indirect control amount is counteracted by a subtractor of software before temperature control, and the counteracting amount may be denoted as $T_{1-n}=-K_{1-n}(W_1)$ and added to the nth laser. Thus, counteracting control amounts on other lasers which are $T_{1-2}=-K_{1-2}(W_1)$, $T_{1-3}=-K_{3-1}(W_1)$, ..., $T_{1-n}=-K_{1-1}(W_1)$ are respectively added to other lasers when the control amount of 1st laser is set (or determined) according to the initial control amount $W_1$.

Then, similarly, counteracting amounts of a temperature initial control amount $W_2$ of the 2nd laser on temperature controllers of the 1st, 3rd, 4th, ..., nth lasers and counteracting amounts of temperature initial control amounts of other 3rd, 4th, ..., nth lasers on temperature control of other lasers are calculated.

After the counteracting amounts are obtained, a corrected temperature control amount of each laser is calculated. The corrected temperature control amount of the 1st laser is $W_1+T_{2-1}+T_{3-1}+T_{4-1}+ \ldots +T_{n-1}$, and the corrected temperature control amount of the nth laser is $W_n+T_{1-n}+T_{2-n}+T_{3-n}+ \ldots +T_{(n-1)-n}$.

In step S806, a die temperature is controlled by the temperature controller according to the corrected control amount to control a wavelength value output from each laser. The control amounts of all lasers in this system are delivered to the temperature controllers at the same time.

The above process is a closed loop control process, and the integration and amplification processing in step S803 is advantageous to the stability of this closed loop control system.

In the specific embodiments of the present invention, since the influence of a change of a die temperature of one laser on die temperatures of other lasers is considered and wiped off from the control of the die temperatures of the other lasers when the temperature controller of each laser is controlled, the problem of thermal cross-talk between the lasers in the multi-path laser is effectively solved, the time for adjusting wavelengths of the multi-path laser is shortened, and the efficiency of the system is improved. Meanwhile, the proportion-integration control process is added in this system, which stabilizes the closed loop control system. On the other hand, all the steps involving calculation in the above process can be realized by software, and thus can lower the upper limit of integration level of photoelectric devices.

The above descriptions are merely embodiments of the present invention, but not intended to limit the scope of the present invention. Any equivalent variation made according to the claims of the present invention shall fall within the scope of the present invention.

What is claimed is:

1. A method for controlling wavelengths of a multi-path laser, comprising:
    obtaining a difference between an actual output wavelength and a target output wavelength of each laser;
    obtaining a corrected control amount of a temperature controller of each laser by decoupling calculation according to the difference, including:
        calculating an initial control amount of the temperature controller of each laser according to the difference;
        calculating, according to the initial control amount, a counteracting control amount of each laser, wherein the counteracting control amount is generated because one laser is affected by temperature controllers of other lasers; and
        calculating the corrected control amount of the temperature controller of each laser according to the initial control amount and the counteracting control amount; and
    determining a die temperature of each laser according to the corrected control amount of the temperature controller.

2. The method according to claim 1, wherein the calculating the initial control amount of the temperature controller of each laser according to the difference comprises:
    performing integration on the difference between the actual output wavelength and the target output wavelength of each laser to obtain an integral difference;
    performing proportional amplification on the difference between the actual output wavelength and the target output wavelength of each laser to obtain an amplified difference; and
    adding the integral difference and the amplified difference corresponding to each laser to obtain the initial control amount of the temperature controller of each laser.

3. The method according to claim 1, wherein the calculating the counteracting control amount of each laser on the temperature controllers of the other lasers according to the initial control amount comprises:
obtaining a thermal influence amount for each laser, wherein the thermal influence amount for each laser is generated because the laser is affected by other lasers, after the die temperature of each laser is controlled according to the initial control amount of each laser; and
calculating, according to the thermal influence amount, the counteracting control amount of the temperature controller of each laser, wherein the counteracting control amount is generated because one laser is affected by the initial control amount of the temperature controller of each of other lasers.

4. The method according to claim 3, wherein the calculating the corrected control amount of the temperature controller of each laser according to the initial control amount and the counteracting control amount comprises:
obtaining the corrected control amount of the temperature controller of each laser by adding the initial control amount of the temperature controller of each laser and the counteracting control amount of the temperature controller of the laser.

5. The method according to claim 1, wherein after the die temperature of each laser is determined according to the corrected control amount of the temperature controller, the method further comprises:
performing the method for controlling wavelengths cyclically until the difference between the actual output wavelength and the target output wavelength of each laser is in a predetermined range.

6. A system for controlling wavelengths of a multi-path laser, comprising:
a multi-path laser, adapted to generate and output optical signals;
a difference module, adapted to calculate a difference between an actual output wavelength and a target output wavelength of each optical signal output from the multi-path laser;
a decoupling module, adapted to obtain a corrected control amount of a temperature controller of each laser by decoupling calculation according to the difference calculated by the difference module, wherein the decoupling module comprises:
an initial amount sub-module, adapted to calculate an initial control amount of the temperature controller of each laser according to the difference between an actual output wavelength and a target output wavelength of optical signal output from the laser calculated by the difference module;
a counteracting amount sub-module, adapted to calculate, according to the initial control amount of the temperature controller of each laser obtained by the initial amount sub-module, a counteracting control amount of each laser, wherein the counteracting control amount is generated because one laser is affected by temperature controllers of other lasers; and
a control amount sub-module, adapted to calculate a corrected control amount of the temperature controller of each laser according to the initial control amount and the counteracting control amount obtained by the initial amount sub-module and the counteracting amount sub-module; and
a temperature control module, adapted to determine a die temperature of each laser according to the corrected control amount obtained by the decoupling module.

7. The system according to claim 6, wherein the initial amount sub-module comprises:
an integration sub-module, adapted to perform integration on the difference between the actual output wavelength and the target output wavelength of optical signal output from each laser to obtain an integral difference;
an amplification sub-module, adapted to perform proportional amplification on the difference between the actual output wavelength and the target output wavelength of optical signal output from each laser to obtain an amplified difference; and
an addition sub-module, adapted to obtain the initial control amount of the temperature controller of each laser, by adding the integral difference corresponding to the laser obtained by the integration sub-module and the amplified difference corresponding to the laser obtained by the amplification sub-module.

8. The system according to claim 6, wherein the counteracting amount sub-module comprises:
a thermal influence amount sub-module, adapted to obtain a thermal influence amount for each laser, wherein the thermal influence amount for each laser is generated because the laser is affected by other lasers, after the die temperature of each laser is controlled according to the initial control amount of each laser; and
a conversion sub-module, adapted to calculate, according to the thermal influence amount obtained by the thermal influence amount sub-module, a counteracting control amount of the temperature controller of each laser, wherein the counteracting control amount is generated because one laser is affected by the initial control amount of the temperature controller of each of other lasers.

* * * * *